(12) United States Patent
Hwang et al.

(10) Patent No.: US 11,691,993 B2
(45) Date of Patent: Jul. 4, 2023

(54) 1,1,1-TRIS(ORGANOAMINO)DISILANE COMPOUNDS AND METHOD OF PREPARING SAME

(71) Applicant: Jiangsu Nata Opto-Electronic Materials Co. Ltd., Jiangsu (CN)

(72) Inventors: Byung K. Hwang, Wilmington, DE (US); Xiaobing Zhou, Wilmington, DE (US)

(73) Assignee: JIANGSU NATA OPTO-ELECTRONIC MATERIALS CO. LTD., Jiangsu (CN)

( * ) Notice: Subject to any disclaimer, the term of this patent is extended or adjusted under 35 U.S.C. 154(b) by 492 days.

(21) Appl. No.: 16/635,452

(22) PCT Filed: Jul. 30, 2018

(86) PCT No.: PCT/US2018/044392
§ 371 (c)(1),
(2) Date: Jan. 30, 2020

(87) PCT Pub. No.: WO2019/027907
PCT Pub. Date: Feb. 7, 2019

(65) Prior Publication Data
US 2021/0101918 A1 Apr. 8, 2021

Related U.S. Application Data

(60) Provisional application No. 62/538,957, filed on Jul. 31, 2017.

(51) Int. Cl.
| | |
|---|---|
| C07F 7/02 | (2006.01) |
| C01B 21/068 | (2006.01) |
| C01B 33/12 | (2006.01) |
| C23C 16/34 | (2006.01) |
| C23C 16/40 | (2006.01) |
| C23C 16/455 | (2006.01) |

(52) U.S. Cl.
CPC ............ C07F 7/025 (2013.01); C01B 21/068 (2013.01); C01B 33/126 (2013.01); C23C 16/345 (2013.01); C23C 16/402 (2013.01); C23C 16/45525 (2013.01)

(58) Field of Classification Search
None
See application file for complete search history.

(56) References Cited

U.S. PATENT DOCUMENTS

| | | | | |
|---|---|---|---|---|
| 11,142,462 | B2* | 10/2021 | Hwang | ............. C23C 16/45553 |
| 2013/0323435 | A1* | 12/2013 | Xiao | ........................ C23C 16/46 546/14 |
| 2015/0094470 | A1 | 4/2015 | Sanchez et al. | |
| 2016/0111272 | A1 | 4/2016 | Girard et al. | |

FOREIGN PATENT DOCUMENTS

| | | |
|---|---|---|
| EP | 2669248 A1 | 12/2013 |
| EP | 2818474 A1 | 12/2014 |
| EP | 2913334 B1 | 12/2018 |
| JP | 2006096675 A | 4/2006 |
| WO | 2007112780 A1 | 10/2007 |

OTHER PUBLICATIONS

International Search Report for PCT/US2018/044392 dated Oct. 12, 2018, 5 pages.
Machine assisted English translation of JP2006096675A obtained from https://patents.google.com/patent on Apr. 29, 2020, 7 pages.
Database WPI Week 200629, Thomson Scientific, London, GB; AN 2006-278510.
Shinobu Tsutsui et al., "Bis(diisopropylamino) silylene and its Dimer", Journal of the American Chemical Society, vol. 120, No. 38, Sep. 1, 1998.
Schuh, Heinz; Schlosser, Thomas; Bissinger, Peter; Schmidbaur, Hubert, "Disilanylamines. Compounds comprising the structural unit silicon-silicon-nitrogen, as single-source precursors for plasma-enhanced chemical vapor deposition (PE-CVD) of silicon nitride", Zeitschrift fuer Anorganische und Allgemeine Chemie (1993), 619(8), 1347-52.
Abedini, Mansour; MacDiarmid, Alan G., "The preparation and properties of some new nitrogen and fluorine derivatives of disilane", Inorganic Chemistry (1963), 2, 608-13.
Soeldner, Marcus; Schier, Annette; Schmidbaur, Hubert, "1,2-Disilanediyl Bis(triflate), F3CSO3—SiH2SiH2—O3SCF3, as the Key Intermediate for a Facile Preparation of Open-Chain and Cyclic 1,1- and 1,2-Diaminodisilanes", Inorganic Chemistry (1997), 36(9), 1758-1763.
Mantey, Steffen; Heinicke, Joachim, "Amino-substituted disilanes by reductive coupling", Organosilicon Chemistry III: From Molecules to Materials, [Muenchner Silicontage], 3rd, Munich, Apr. 1996 (1998), 254-256.

(Continued)

*Primary Examiner* — Clinton A Brooks
(74) *Attorney, Agent, or Firm* — Morgan, Lewis & Bockius LLP

(57) ABSTRACT

A 1,1,1-tris(organoamino)disilane compound and a method of preparing the 1,1,1-tris(organoamino)disilane compound are disclosed. The method comprises aminating a 1,1,1-trihalodisilane with an aminating agent comprising an organoamine compound to give a reaction product comprising the 1,1,1-tris(organoamino)disilane compound, thereby preparing the 1,1,1-tris(organoamino)disilane compound. A film-forming composition is also disclosed. The film-forming composition comprises the 1,1,1-tris(organoamino)disilane compound. A film formed with the film-forming composition, and a method of forming the film, are also disclosed. The method of forming the film comprises subjecting the film-forming composition comprising the 1,1,1-tris(organoamino)disilane compound to a deposition condition in the presence of a substrate, thereby forming the film on the substrate.

18 Claims, No Drawings

(56) References Cited

OTHER PUBLICATIONS

Heinicke, Joachim; Mantey, Steffen, "Aminosubstituted disilanes: synthesis by unsymmetrical and symmetrical reductive coupling", Heteroatom Chemistry (1998), 9(3), 311-316.
Heinicke, Joachim; Mantey, Steffen; Oprea, Anca; Kindermann, Markus K.; Jones, Peter G., "Synthesis of aminotri-and aminotetrasilanes by cross-coupling of aminochlorosilanes with chlorotrimethylsilane", Heteroatom Chemistry (1999), 10(7), 605-614.
Wiberg, Egon; Stecher, Oskar; Neumaier, Alfons, "Hexadimethylaminodisilane Si2(NMe2)6", Inorganic and Nuclear Chemistry Letters (1965), 1(2), 33-4.
Wan, Yanjian; Verkade, John G., "Synthesis of (dialkylamino)disilanes", Inorganic Chemistry (1993), 32(3), 341-4.

\* cited by examiner

1,1,1-TRIS(ORGANOAMINO)DISILANE COMPOUNDS AND METHOD OF PREPARING SAME

CROSS-REFERENCE TO RELATED APPLICATIONS

This application is the national stage of International Appl. No. PCT/US2018/044392 filed on 30 Jul. 2018, which claims priority to and all advantages of U.S. Patent Application No. 62/538,957 filed on 31 Jul. 2017, the contents of which are incorporated herein by reference.

FIELD OF THE INVENTION

The present invention generally relates to disilane compounds and, more specifically, to 1,1,1-tris(organoamino) disilane compounds, a method of preparing the 1,1,1-tris (organoamino)disilane compounds, a film-forming composition comprising at least one of the 1,1,1-tris(organoamino)disilane compounds, a method of forming a film with the film-forming composition, and a film formed thereby.

DESCRIPTION OF THE RELATED ART

Silane compounds are understood in the art and utilized in diverse end use applications. For example, silane compounds may be utilized to prepare organopolysiloxanes, e.g. silicone polymers or resins. Alternatively, silane compounds are ubiquitously utilized in the electronics industry. For example, silane compounds are utilized to form thin films via deposition (e.g. chemical vapor deposition, atomic layer deposition, etc.). The thin films may comprise crystalline silicon, silica ($SiO_2$), silicon nitride ($Si_3N_4$), or other Si-containing functionality, depending on a selection of the silane compound (i.e., silicon precursor) utilized. Typically, silicon precursors include silicon-bonded hydrogen atoms (silicon hydride) and/or silicon-bonded halogen atoms. For example, conventional silicon precursors include methylsilane, polysilazane, tetraethylorthosilicate, and hexachlorodisilane. However, films formed with these conventional silicon precursors, such as in conventional processes utilizing elevated temperature hydrolysis and/or condensation, are prone to certain defects, including voids and cracks. Voids, cracks, and other defects in turn create inhomogeneities in the films, which may adversely affect performance (e.g. as a dielectric material).

SUMMARY OF THE INVENTION

The present invention provides a 1,1,1-tris(organoamino) disilane compound of formula (I):

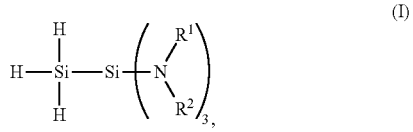

wherein each $R^1$ is an independently selected hydrocarbyl group having from 1 to 10 carbon atoms, and each $R^2$ is an independently selected hydrocarbyl group having from 1 to 10 carbon atoms or H.

A method of preparing the 1,1,1-tris(organoamino)disilane compound is also provided. The method comprises aminating a 1,1,1-trihalodisilane with an aminating agent to give a reaction product comprising a 1,1,1-tris(organoamino)disilane compound, thereby preparing the 1,1,1-tris (organoamino)disilane compound. The aminating agent comprises an organoamine compound having the formula $HNR^1R^2$, wherein each $R^1$ is an independently selected hydrocarbyl group having from 1 to 10 carbon atoms, and each $R^2$ is an independently selected hydrocarbyl group having from 1 to 10 carbon atoms or H.

The reaction product comprising the 1,1,1-tris(organoamino)disilane compound formed in accordance with the preparation method is also provided.

A film-forming composition is further provided. The film-forming composition comprises the 1,1,1-tris(organoamino)disilane compound.

A method of forming a film with the film-forming composition is also provided. The formation method comprises subjecting the film-forming composition comprising the 1,1,1-tris(organoamino)disilane compound to a deposition condition in the presence of a substrate, thereby forming the film on the substrate.

A film formed in accordance with the formation method is additionally provided.

DETAILED DESCRIPTION OF THE INVENTION

A 1,1,1-tris(organoamino)disilane compound is disclosed. The 1,1,1-tris(organoamino)disilane compound may be utilized in diverse end use applications. For example, the 1,1,1-tris(organoamino)disilane compound may be utilized as a precursor in preparing Si-containing films, e.g. via chemical vapor deposition (CVD) or atomic layer deposition (ALD). The 1,1,1-tris(organoamino)disilane compound is not limited to a particular end use.

The 1,1,1-tris(organoamino)disilane compound has the chemical structure of formula (I):

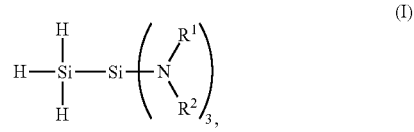

wherein each $R^1$ is an independently selected hydrocarbyl group having from 1 to 10 carbon atoms, and each $R^2$ is an independently selected hydrocarbyl group having from 1 to 10 carbon atoms or H.

As introduced above, each $R^1$ is an independently selected hydrocarbyl group having from 1 to 10 carbon atoms, and each $R^2$ is an independently selected hydrocarbyl group having from 1 to 10 carbon atoms or H. With regard to hydrocarbyl groups for use as $R^1$ and/or $R^2$, suitable hydrocarbyl groups may be linear, branched, cyclic, or combinations thereof. Cyclic hydrocarbyl groups encompass aryl groups as well as saturated or non-conjugated cyclic groups. Cyclic hydrocarbyl groups may be monocyclic or polycyclic. Linear and branched hydrocarbyl groups may independently be saturated or unsaturated, and thus may include alkyl, alkenyl, and/or alkynyl functionality (i.e., may be or comprise alkyl, alkenyl, and/or alkynyl groups). Examples of alkyl groups are exemplified by methyl, ethyl, propyl (e.g. iso-propyl and/or n-propyl), butyl (e.g. isobutyl, n-butyl, tert-butyl, and/or sec-butyl), pentyl (e.g. isopentyl, neopentyl, and/or tert-pentyl), hexyl, as well as branched saturated hydrocarbon groups having up to 10 carbon atoms. Suitable aryl groups are exemplified by, but not limited to, phenyl, tolyl, xylyl, naphthyl, benzyl, and dimethyl phenyl. Example of combinations of linear and cyclic hydrocarbyl groups include aralkyl groups. Suitable alkenyl groups include vinyl, allyl, propenyl, isopropenyl, butenyl, isobutenyl, pentenyl, heptenyl, hexenyl, cyclohexenyl groups, and the like.

In certain embodiments, each of $R^1$ and $R^2$ is an independently selected alkyl group, such that the 1,1,1-tris(organoamino)disilane compound is a 1,1,1-tris(dialkylamino)disilane compound. In some such embodiments, each $R^1$ and $R^2$ is methyl, such that the 1,1,1-tris(dialkylamino)disilane compound is a 1,1,1-tris(dimethylamino)disilane compound having the following structure:

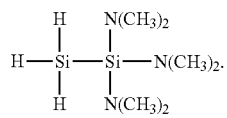

In specific embodiments, $R^1$ and $R^2$ are different from one another. For example, in such embodiments, $R^2$ may include more or fewer carbon atoms than $R^1$. In other such embodiments, $R^2$ is H, such that the 1,1,1-tris(organoamino)disilane compound is a 1,1,1-tris(alkylamino)disilane compound. For example, in some such embodiments, $R^1$ is methyl and $R^2$ is H, such that the 1,1,1-tris(alkylamino)disilane compound is a 1,1,1-tris(ethylamino)disilane compound having the following structure:

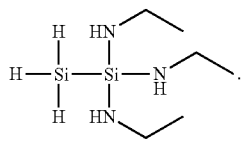

A method of preparing the 1,1,1-tris(organoamino)disilane compound is also provided (the "preparation method"). The 1,1,1-tris(organoamino)disilane compound is prepared in a reaction product and, as introduced above, may be utilized in diverse end use applications. For example, the 1,1,1-tris(organoamino)disilane compound may be utilized as a starting component when preparing organopolysiloxanes, e.g. via co-hydrolysis, co-condensation, etc.

The invention has technical and non-technical advantages. One of the problems solved by the processes described herein is providing a process of making a trisaminodisilane. Conventional processes can be used to prepare monoaminodisilanes (or aminodisilanes), bisaminodisilanes, tetrakisaminodisilanes, pentakisaminodisilanes, and hexakisaminodisilanes, but not trisaminodisilanes. As such, there is also no conventional process for making an isomerically-pure trisaminodisilane, such as a 1,1,2-trisaminodisilane or a 1,1,1-trisaminodisilane, as no general procedures for making trisaminodisilanes have been disclosed. Without wishing to be bound by theory, it is believed that steric hindrance of one or more amino groups substituted onto a single silicon atom of a 1,1,1-trihalodisilane imparts a large steric barrier to selective substitution of all three of the halogen atoms. This prohibitive steric hindrance is compounded by a second obstacle, which is the labile nature (i.e. easy cleavage) of the Si—Si bond in 1,1,1-trihalodisilane molecules. In fact, this Si—Si bond is readily cleaved by strong aminating agents, and/or under harsh amination conditions, which are typically needed to overcome steric hindrance in the amination of other molecules.

Accordingly, an additional problem solved by the preparation method described herein is providing an isomerically-selective process for making a 1,1,1-trisaminodisilane and, in particular, the 1,1,1-tris(organoamino)disilane compounds described herein. As no conventional process has accomplished this feat, the preparation method prepares the 1,1,1-tris(organoamino)disilane compound in higher purity, higher yield, greater selectivity, or a combination of any two or more thereof, relative to conventional processes. Moreover, the preparation method can be scaled up for high volume production of the 1,1,1-tris(organoamino)disilane compound at low cost, particularly as compared to conventional processes.

The preparation method comprises aminating a 1,1,1-trihalodisilane with an aminating agent to give a reaction product comprising the 1,1,1-tris(organoamino)disilane compound, thereby preparing the 1,1,1-tris(organoamino)disilane compound.

As understood in the art, 1,1,1-trihalodisilane has the chemical structure of formula (II):

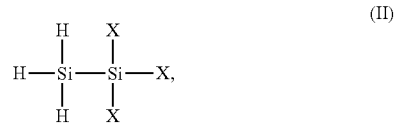

where each X is an independently selected halogen atom (e.g. F, Cl, Br, I). The 1,1,1-trihalodisilane may be synthesized, prepared, or otherwise obtained. For example, in certain embodiments, the 1,1,1-trihalodisilane is 1,1,1-trichlorodisilane ($H_3SiSiCl_3$). 1,1,1-trichlorodisilane may be synthesized via chlorination of $Si_2H_6$, by reaction of phenylated disilanes with $HCl/AlCl_3$, by high temperature coupling of $SiH_4$ and $SiCl_4$, etc.

The aminating agent comprises an organoamine compound having the formula $HNR^1R^2$. As will be understood in view of the description herein, during amination of the 1,1,1-trihalodisilane, $R^1$ of the organoamine compound becomes $R^1$ of the 1,1,1-tris(organoamino)disilane compound, and $R^2$ of the organoamine compound becomes $R^2$ of the 1,1,1-tris(organoamino)disilane compound. As such, each $R^1$ of the organoamine compound is an independently selected hydrocarbyl group having from 1 to 10 carbon atoms, and each $R^2$ of the organoamine compound is an independently selected hydrocarbyl group having from 1 to 10 carbon atoms or H, as described above (e.g. with respect to the 1,1,1-tris(organoamino)disilane compound). Likewise, the examples of suitable hydrocarbyl groups also described above apply equally to $R^1$ and $R^2$ of the organoamine compound.

In certain embodiments, the organoamine compound comprises, alternatively is, dimethylamine (i.e., $HN(CH_3)_2$). The dimethylamine may be synthesized, prepared, or otherwise obtained. For example, dimethylamine may be synthesized via catalytic reaction of methanol and ammonia at elevated temperature and/or pressure. Dimethylamine is also commercially available from numerous suppliers. In specific embodiments, the aminating agent comprises, alternatively consists essentially of, or alternatively consists of, dimethylamine.

In some embodiments, the organoamine compound comprises, alternatively is, ethylamine (i.e., $H_2NCH_2CH_3$). The ethylamine may be synthesized, prepared, or otherwise obtained. For example, ethylamine is commercially available from numerous suppliers. In specific embodiments, the aminating agent comprises, alternatively consists essentially of, or alternatively consists of, ethylamine.

It certain embodiments, the aminating agent comprises, alternatively is disposed in, a carrier vehicle, such as a solvent or dispersant. The carrier vehicle, if present, may comprise, alternatively consist essentially of, or alternatively consist of, an organic solvent. The organic solvent can be a ketone such as acetone, methylethyl ketone, or methyl isobutyl ketone; an aromatic hydrocarbon such as benzene, toluene, or xylene; an aliphatic hydrocarbon such as heptane, hexane, or octane; a glycol ether such as an ethylene, propylene, and/or butylene glycol, propylene glycol methyl ether, dipropylene glycol methyl ether, propylene glycol n-butyl ether, propylene glycol n-propyl ether, or ethylene glycol n-butyl ether; a halogenated hydrocarbon such as dichloromethane, 1,1,1-trichloroethane or methylene chloride; chloroform; dimethyl sulfoxide; dimethyl formamide, acetonitrile; tetrahydrofuran; white spirits; mineral spirits; naphtha; n-methyl pyrrolidone; or a combination thereof. Typically, the carrier vehicle, if present, is anhydrous (i.e., free from, alternatively substantially free from, water). In particular embodiments, the carrier vehicle comprises an aliphatic hydrocarbon. In these or other embodiments, the carrier vehicle is anhydrous hexane. In some embodiments, the aminating agent itself may be defined as a carrier vehicle. For example, in such embodiments, the aminating agent, or one or more components thereof, may act as a solvent or dispersant to solvate or disperse the 1,1,1-trihalodisilane, any other component(s) of the aminating agent, and any reaction products formed therewith. As such, in particular embodiments where the aminating agent consists essentially of, or alternatively consists of, dimethylamine, the dimethylamine may act as the carrier vehicle. In particular embodiments, the aminating agent is free from carrier vehicles. Conversely, in other embodiments, the aminating agent is free from carrier vehicles other than dimethylamine.

In some embodiments, the aminating agent further comprises a halogen scavenging agent. The halogen scavenging agent may be any compound or combination of compounds suitable for interacting with a halogen ion (e.g. a halide) in the presence of the aminating agent (e.g. the organoamine compound), the 1,1,1-trihalodisilane, and disilane reaction products thereof. As such, it is to be appreciated that the particular halogen scavenging agent selected for use in the preparation method may be dependent on, for example, any one or more of the particular aminating agent, carrier vehicle, reaction conditions, reaction vessel(s), and the like, utilized in the preparation method. Accordingly, any one or more halogen scavenging agents may be used in the preparation method, so long as the use of such one or more halogen scavenging agents does not prevent or diminish the purpose of the preparation method, which is to prepare the 1,1,1-tris(organoamino)disilane compound. Furthermore, the interaction of the halogen scavenging agent and the halogen ion may be defined as a reaction, a coordination, a complex, an ion-pairing, and the like, or combinations thereof. As such, the halogen scavenging agent may form a covalent or ionic bond with the halogen ion. In certain embodiments, the halogen scavenging agent is a base that is protonated (e.g. via $H^+$) to form a cationic conjugate acid which ion-pairs with the halogen ion. In these or other embodiments, the halogen scavenging agent is a salt comprising a cation (e.g. a metal) and a non-nucleophilic anion (e.g. a base), which interacts with the halogen ion in the present embodiments to form a metal-halide and a conjugate acid of the non-nucleophilic anion. In such embodiments, the halogen scavenging agent may be further defined as an acid scavenger or acid scavenging agent.

Accordingly, examples of halogen scavenging agents include amines, such as cyclic and/or acyclic tertiary hydrocarbyl amines (e.g. alkyl, aryl, and alkylaryl amines, such as trimethylamine, trimethylamine, tripropylamine, N,N-dimethylaniline (PhNMe$_2$), etc.) and hindered amines (e.g. substituted piperidines, piperazinones, and the like); aromatic heterocyclic nitrogen-containing compounds (e.g. azirine, pyridine, N-methylpyrrole, etc.); metal salts of acids (e.g. calcium, sodium, lithium, magnesium, strontium, barium, zinc, and/or aluminum salts of fatty acids, aromatic or alicyclic carboxylic acids, phosphoric acids, sulfates, and the like); alkenes; hydrazones; cyclic esters; and the like; and combinations thereof. In certain embodiments, the halogen scavenging agent may comprise halogen and/or acid scavenging polymers, resins, powders, and the like, or combinations thereof. Methods of preparing such halogen scavenging agents are understood in the art and many of these compounds are commercially available from various suppliers. In certain embodiments, the organoamine compound of the aminating agent acts as the halogen scavenging agent. In these or other embodiments, the aminating agent comprises a halogen scavenging agent other than the organoamine compound.

The relative amount of the aminating agent, or the organoamine compound thereof, utilized in the amination may vary dependent upon the particular aminating agent selected, the amination parameters utilized, etc. The molar ratio of the aminating agent to the 1,1,1-trihalodisilane influences conversion and selectivity. Moreover, as described above, the aminating agent may also comprise, or be used as, the carrier vehicle and/or the halogen scavenging agent. As such, the relative amounts of the aminating agent and the 1,1,1-trihalodisilane, as well as the molar ratio thereof, may vary. In some embodiments, the molar ratio of the 1,1,1-trihalodisilane to the aminating agent is from 1:3 to 1:1000, alternatively from 1:6 to 1:1000. As the aminating agent comprises, alternatively is, the organoamine compound, the 1,1,1-trihalodisilane and the organoamine compound of the aminating agent are typically utilized in similar molar ratios of 1,1,1-trihalodisilane to organoamine compound, i.e., of from 1:3 to 1:1000, alternatively from 1:6 to 1:1000. It is to be appreciated that at the low end of this typical range (i.e., 1:3), the organoamine compound should be theoretically consumed (i.e., in a perfect conversion) during the amination of the 1,1,1-trihalodisilane, as the formation of the 1,1,1-tris(organoamino)disilane compound from each molar equivalent of 1,1,1-trihalodisilane requires three molar equivalents of the organoamine compound of the aminating agent. As such, while the present disclosure contemplates and expressly includes forming the 1,1,1-tris(organoamino)disilane compound with less than a 1:3 molar ratio of the 1,1,1-trihalodisilane to the organoamine compound of the aminating agent, including for example a 1:1 or a 1:2 molar ratio of the 1,1,1-trihalodisilane to the organoamine compound of the aminating agent, a 1:3 molar ratio or greater is typically utilized (e.g. to increase yield). Likewise, the high end of this typical range (i.e., 1:1000) is meant to represent the utilization of the organoamine compound of the aminating agent in excess of the stoichiometric requirements for aminating 1,1,1-trihalodisilane to form the 1,1,1-tris(organoamino)disilane compound, such as when the organoamine compound is also used as the carrier vehicle and/or the halogen scavenging agent. As such, a greater than 1:1000 ratio of the 1,1,1-trihalodisilane to the organoamine compound of the aminating agent may also be utilized.

Likewise, the halogen scavenging agent may be used in any amount, and the amount utilized may vary dependent upon the particular aminating agent, halogen scavenging agent, and/or carrier vehicle(s) selected, the amination parameters utilized, etc. As understood in the art, each molar equivalent of the 1,1,1-trihalodisilane aminated with the aminating agent to form the 1,1,1-tris(organoamino)disilane compound produces three molar equivalents of halogen ion (e.g. halide). Typically, such halogen ion is also protonated (e.g. via an amine hydrogen of the organoamine compound during the amination) to form an equivalent conjugate acid (i.e., hydrogen halide, e.g. HCl, HBr, etc.). Accordingly, at least 3 functional molar equivalents of the halogen scavenging agent is typically utilized for every 1 mole of 1,1,1-trihalodisilane being aminated. The term "functional molar equivalent" is used herein to refer to a molar equivalent of halogen ion and/or hydrogen halide that may interact with each mole of the halogen scavenging agent. For example, the organoamine compound is a primary or secondary amine, which can interact with (i.e., scavenge) hydrogen halide in a one-to-one ratio, (i.e., the organoamine compound comprise one scavenging functionality per molar equivalent). As such, in embodiments where the organoamine compound of the aminating agent is also utilized as the halogen scavenging agent, at least 3 molar equivalents of the organoamine compound are utilized as the halogen scavenging agent for every one molar equivalent of 1,1,1-trihalodisilane being aminated. In such embodiments, the 1,1,1-trihalodisilane and the organoamine compound of the aminating agent are thus typically utilized in a molar ratio of 1,1,1-trihalodisilane to organoamine compound of at least 1:6, such as a ratio of at least 1:6.5, alternatively of at least 1:7, alternatively of at least 1:10, alternatively of at least 1:15, alternatively of at least 1:1000.

However, in certain embodiments the aminating agent comprises a halogen scavenging agent other than the organoamine compound. In such certain embodiments, the halogen scavenging agent may have a functionality per molar equivalent of two or more (e.g. 2, 3, 4, 5, 6, or higher). Accordingly, the molar ratio of the 1,1,1-trihalodisilane to the halogen scavenging agent of the aminating agent may vary, especially depending on the particular halogen scavenging agent utilized. In some embodiments, the molar ratio of the 1,1,1-trihalodisilane to the halogen scavenging agent of the aminating agent is from 1:0.5 (e.g. when the halogen scavenging agent is multifunctional) to 1:1000 (e.g. when the halogen scavenging agent is utilized in gross excess, such as when also utilized as a carrier vehicle). In these or other embodiments, the molar ratio of the 1,1,1-trihalodisilane to the halogen scavenging agent of the aminating agent is from 1:1 to 1:1000, alternatively from 1:2 to 1:1000, alternatively from 1:3 to 1:1000, alternatively from 1:4 to 1:1000.

It is to be appreciated that the typical molar ratios described above may be additive or inclusive. For example, where the dimethylamine of the aminating agent is also utilized as the halogen scavenging agent, the molar ratio of the 1,1,1-trihalodisilane to the organoamine compound of the aminating agent may be selected as 1:6 on the basis of 3 molar equivalents of the organoamine compound for the amination, and 3 molar equivalents of the organoamine compound to scavenge halogen ions. Conversely, where the organoamine compound of the aminating agent is also utilized as the carrier vehicle, the molar ratio of the 1,1,1-trihalodisilane to the organoamine compound of the aminating agent may be selected as or approaching 1:1000, or 1:>1000, on the basis of using a gross excess of molar equivalents of the organoamine compound for aminating and halogen scavenging, and also to dissolve or disperse the components of the amination.

Aminating the 1,1,1-trihalodisilane generally comprises combining the 1,1,1-trihalodisilane and the aminating agent. Combining the 1,1,1-trihalodisilane and the aminating agent may also be referred to as contacting the 1,1,1-trihalodisilane and the aminating agent. Said differently, there is no proactive step required for aminating beyond combining the 1,1,1-trihalodisilane and the aminating agent. As such, combining the 1,1,1-trihalodisilane and the aminating agent according to the preparation method gives the 1,1,1-tris (organoamino)disilane compound. Typically, the amination is carried out in a vessel or reactor. The 1,1,1-trihalodisilane and the aminating agent may be fed together or separately to the vessel or reactor, or may be disposed in the vessel or reactor in any order of addition. When aminating is carried out at a reduced temperature, as described below, the vessel or reactor may be cooled in any suitable manner, e.g. via a jacket, ice bath, chiller, etc. Various types of vessels or reactors can be utilized, and the preparation method is not limited to a particular one.

In certain embodiments, aminating the 1,1,1-trihalodisilane to prepare the reaction product comprising the 1,1,1-tris(organoamino)disilane compound is carried out in the presence of a reaction vehicle. In such embodiments, the reaction vehicle typically comprises, alternatively consists essentially of, alternatively consists of, one or more organic solvents. Specific examples of suitable organic solvents for use as or in the reaction vehicle are introduced above with regard to potential carrier vehicles for the aminating agent. Typically, the reaction vehicle is free from, alternatively substantially free from, water (i.e., is anhydrous). In specific embodiments, the reaction vehicle is anhydrous hexane. Moreover, the reaction vehicle may be combined with the 1,1,1-trihalodisilane and/or the aminating agent prior to the amination. Furthermore, the reaction vehicle may be the same as or different than the carrier vehicle. In particular embodiments, the reaction vehicle and the carrier vehicle are the same. In such embodiments, the organoamine compound of the aminating agent is not the carrier vehicle. As understood in the art, any amount the reaction vehicle may be used, depending on e.g. the particular aminating conditions utilized, the scale of the amination, etc. For example, in certain embodiments, a first amount of the reaction vehicle is combined with the 1,1,1-trihalodisilane prior to combining the 1,1,1-trihalodisilane and the aminating agent. In such embodiments, the first amount of the reaction vehicle may be selected to form a solution of the 1,1,1-trihalodisilane having a particular molarity (M), such as from 0.1 to 10, alternatively from 0.25 to 4, alternatively from 0.5 to 3, alternatively from 0.75 to 2, alternatively from 0.75 to 1.5, alternatively from 0.75 to 1.25, alternatively from 0.9 to 1.1, M. In these or other embodiments, a second amount of the reaction vehicle is combined with the aminating agent prior to combining the 1,1,1-trihalodisilane and the aminating agent. In such embodiments, the second amount of the reaction vehicle may be selected to form a solution of the aminating agent having a particular molarity, such as from 0.01 to 10, alternatively from 0.2 to 4, alternatively from 0.3 to 3, alternatively from 0.4 to 2, alternatively from 0.5 to 1, alternatively from 0.6 to 0.9, M.

As described above, the 1,1,1-trihalodisilane and the aminating agent may be fed to the vessel or reactor sequentially over time or all at once. As such, the 1,1,1-trihalodisilane and the aminating agent may be combined simultaneously, incrementally, etc. In some embodiments, the aminating agent is incrementally combined with the 1,1,1-trihalodisilane over time. In other embodiments, the 1,1,1-trihalodisilane is incrementally combined with the aminating agent over time. Likewise, as understood in the art, the reaction vehicle may be fed into the vessel or reactor at any time relative to the 1,1,1-trihalodisilane and the aminating agent, but is typically present in the vessel, at least in some amount, at the start of amination. Similarly, in some embodiments, the first or second amount of the reaction vehicle may be combined with the 1,1,1-trihalodisilane or the aminating agent, respectively, before or after being fed into the vessel or reactor. In certain embodiments, the amination comprises combining the solution of the 1,1,1-trihalodisilane and the first amount of the reaction vehicle with the solution of the aminating agent and the second amount of the reaction vehicle.

Parameters may be modified during amination of the 1,1,1-trihalodisilane to prepare the reaction product comprising the 1,1,1-tris(organoamino)disilane compound. For example, temperature, pressure, and other parameters may be independently selected or modified during amination of the 1,1,1-trihalodisilane to prepare the reaction product comprising the 1,1,1-tris(organoamino)disilane compound. Any of these parameters may independently be an ambient parameter (e.g. room temperature and/or atmospheric pressure) and/or a non-ambient parameter (e.g. reduced or elevated temperature and/or reduced or elevated pressure). Any parameter may also be modified in real time, i.e., during the preparation method, or may be static. In some embodiments, two or more parameters may be linked, such that modifying one parameter causes or otherwise results in a modification of another parameter.

In certain embodiments, aminating the 1,1,1-trihalodisilane to prepare the reaction product comprising the 1,1,1-tris(organoamino)disilane compound is carried out at a reduced temperature. The reduced temperature is typically from −78 to less than ambient temperature (e.g. 22-24° C.), alternatively from −60 to 20, alternatively from −52 to 15, alternatively from −32 to 12, alternatively from −20 to 10, alternatively from −15 to 5, alternatively from −10 to 5, alternatively from −5 to 0, ° C. In certain embodiments, the reduced temperature is less than 0° C.

The 1,1,1-trihalodisilane and/or the aminating agent may be independently cooled and combined, combined and cooled (prior to, during, and/or after such combination), etc. In certain embodiments, the 1,1,1-trihalodisilane is cooled to the reduced temperature, and the aminating agent is combined with the 1,1,1-trihalodisilane at the reduced temperature. In these or other embodiments, the aminating agent is cooled to the reduced temperature and combined with the 1,1,1-trihalodisilane at the reduced temperature.

The 1,1,1-trihalodisilane and the aminating agent independently may be stored under an anhydrous condition (i.e., free from, or substantially free from, water), under an inert atmosphere, or typically, both, i.e., an anhydrous inert atmosphere. The inert atmosphere may be a gas of molecular nitrogen, helium, argon, or a mixture of any two or more thereof. Similarly, aminating the 1,1,1-trihalodisilane to prepare the reaction product comprising the 1,1,1-tris(organoamino)disilane compound may be carried out under an anhydrous condition and/or under an inert atmosphere. In certain instances, the 1,1,1-trihalodisilane and/or the aminating agent independently may be stored in the reaction vehicle, such as in the form of the solution(s) described above.

The preparation method may further comprise agitating the 1,1,1-trihalodisilane and the aminating agent (e.g. via stirring, mixing, blending, shaking, swirling, tumbling, etc.). The agitating may enhance mixing and contacting together of the 1,1,1-trihalodisilane and the organoamine compound of the aminating agent, in a reaction mixture thereof. Such contacting independently may use other conditions, with or without the agitating. The other conditions may be tailored to enhance the contacting, and thus reaction (i.e., amination), of the 1,1,1-trihalodisilane so as to form the 1,1,1-tris(organoamino)disilane compound in a particular contacting step. Other conditions may be result-effective conditions for enhancing reaction yield or minimizing the amount of a particular reaction by-product included within the reaction product along with the 1,1,1-tris(organoamino)disilane compound.

The time during which amination of the 1,1,1-trihalodisilane to prepare the reaction product comprising the 1,1,1-tris(organoamino)disilane compound is carried out is a function of scale, reaction parameters and conditions, selection of the aminating agent, etc. In certain embodiments, the time during which amination of the 1,1,1-trihalodisilane to prepare the reaction product comprising the 1,1,1-tris(organoamino)disilane compound is carried out is from greater than 0 to 24 hours, alternatively from greater than 0 to 12 hours, alternatively from greater than 0 to 6 hours, alternatively from greater than 0 to 2 hours, after combining the 1,1,1-trihalodisilane and the aminating agent. However, in certain embodiments, the time during which amination of the 1,1,1-trihalodisilane to prepare the reaction product comprising the 1,1,1-tris(organoamino)disilane compound is carried out is greater than 24 hours (e.g. when performed on a large scale, using a hindered organoamine in the aminating agent, using less reactive components during the amination, using lower temperatures, etc.). In such embodiments, the amination time may be from greater than 24 to 96 hours, such as from 24 to 84, alternatively from 24 to 72, alternatively from 36 to 72, alternatively from 48 to 72, alternatively from 50 to 70, hours. In certain instances, the amination time may be greater than 96 hours.

The reaction product comprising the 1,1,1-tris(organoamino)disilane compound is formed in accordance with the preparation method described above is also provided. As understood in the art, the yield and purity of the reaction product may vary, e.g. depending on the amination conditions and the particular aminating agent, halogen scavenging agent, carrier vehicle, and/or vehicle utilized in the preparation method. In certain embodiments, the reaction product comprises the 1,1,1-tris(organoamino)disilane compound in an amount of from 0.01 to 10, alternatively from 0.1 to 5, alternatively from 1 to 3, weight percent based on the total weight of the reaction product. However, the concentration of the 1,1,1-tris(organoamino)disilane compound in the reaction product may vary from these ranges, e.g. may be greater than 10, alternatively greater than 15, alternatively greater than 20, alternatively greater than 25, weight percent based on the total weight of the reaction product. The concentration of the 1,1,1-tris(organoamino)disilane compound in the reaction product may be determined via methods understood in the art, e.g. gas chromatography, optionally via a gas chromatography-flame ionization detector (GC-FID and/or GC-TCD).

In some embodiments, the preparation method further comprises isolating the 1,1,1-tris(organoamino)disilane compound from the reaction product. In such embodiments, any suitable technique for isolation may be utilized. Examples of suitable isolation techniques include decanting, distilling, evaporating, extracting, filtering, freeze drying, gas chromatography, ion exchange chromatography, partitioning, phase separating, reverse phase liquid chromatography, stripping, volatilizing, and washing. It is to be appreciated that isolating may include, and thus may be referred to as, purifying the 1,1,1-tris(organoamino)disilane compound. As used herein, isolating the 1,1,1-tris(organoamino)disilane compound is typically defined as increasing the relative concentration of the 1,1,1-tris(organoamino)disilane compound as compared to other compounds in combination therewith. As such, as is understood in the art, isolating/purifying may comprise removing the other compounds from such a combination (i.e., decreasing the amount of impurities combined with the 1,1,1-tris(organoamino)disilane compound) and/or removing the 1,1,1-tris(organoamino)disilane compound itself from the combination. In certain embodiments, isolating the 1,1,1-tris(organoamino)disilane compound from the reaction product comprises filtering the reaction product to give the 1,1,1-tris(organoamino)disilane compound. In such embodiments, the reaction product typically comprises solids (e.g. salts) that are removed via the filtration.

In specific embodiments, filtering the reaction product prepares a crude reaction product comprising the 1,1,1-tris(organoamino)disilane compound, and the preparation method further comprises purifying the crude reaction product to give the 1,1,1-tris(organoamino)disilane compound. For example, the reaction product may be filtered upon formation such that the crude reaction product is collected (e.g. as a filtrate). The crude reaction product has a higher relative content of the 1,1,1-tris(organoamino)disilane compound (as compared to non-solvent impurities) than the reaction product. The crude reaction product may then be purified (e.g. via distillation) to isolate the 1,1,1-tris(organoamino)disilane compound. As such, in some embodiments, isolating the 1,1,1-tris(organoamino)disilane compound from the reaction product comprises distilling the reaction product and/or the crude reaction product comprising the 1,1,1-tris(organoamino)disilane compound to give the 1,1,1-tris(organoamino)disilane compound.

Distilling the reaction product and/or the crude reaction product comprising the 1,1,1-tris(organoamino)disilane compound is typically carried out at (i) an elevated temperature; (ii) a reduced pressure; or (iii) both an elevated temperature and reduced pressure. By elevated or reduced, it is meant as compared to ambient conditions (e.g. room temperature and atmospheric pressure).

The elevated temperature is typically from greater than ambient temperature to 150, alternatively from 30 to 140, alternatively from 40 to 130, alternatively from 50 to 120, alternatively from 60 to 110, alternatively from 70 to 100, alternatively from 75 to 95, alternatively from 80 to 90, ° C.

The reduced pressure is typically operated as a vacuum, although any reduced pressure between vacuum and atmospheric pressure may be utilized. For example, the reduced pressure may be from greater than 0 to 100, alternatively from greater than 0 to 80, alternatively from greater than 0 to 60, alternatively from greater than 0 to 40, alternatively from greater than 0 to 20, alternatively from greater than 0 to 10, alternatively from 1 to 5, Torr.

It is to be appreciated that distilling the reaction product and/or the crude reaction product may comprise distilling the 1,1,1-tris(organoamino)disilane compound away from other compounds or, alternatively, may comprise distilling other compounds away from the 1,1,1-tris(organoamino)disilane compound. As such, the elevated temperature and/or reduced pressure may also differ from the ranges set forth above.

In certain embodiments, distilling the reaction product further comprises condensing and collecting the crude reaction product. The crude reaction product may be condensed and collected at any suitable temperature. In certain embodiments, the crude reaction product is condensed at a temperature of from −5 to 25, alternatively from −5 to 20, alternatively from 0 to 15, alternatively from 0 to 10, alternatively from 1 to 6, ° C. However, a temperature less than −5° C. may also be utilized.

As understood in the art, the yield and purity of the crude reaction product, and the 1,1,1-tris(organoamino)disilane compound may vary depending on the amination conditions, isolation techniques, particular aminating agent, organoamine compound, halogen scavenging agent, carrier vehicle, and/or vehicle utilized in the preparation method.

The concentration of the 1,1,1-tris(organoamino)disilane compound in the crude reaction product may vary from the ranges set forth herein. The concentration of the 1,1,1-tris(organoamino)disilane compound in the crude reaction product may be determined via methods understood in the art, e.g. GC-FID. In particular embodiments, the crude reaction product comprises the 1,1,1-tris(organoamino)disilane in an amount of at least 10, alternatively at least 20, alternatively at least 30, alternatively at least 40, alternatively at least 50, alternatively at least 60, alternatively at least 70, alternatively at least 80, alternatively at least 90, alternatively at least 95, alternatively at least 99, wt. % based on the total weight of the crude reaction product.

As introduced above, in some embodiments, isolating the 1,1,1-tris(organoamino)disilane compound from the reaction product further comprises purifying the crude reaction product to give the purified reaction product. In such embodiments, the crude reaction product may be purified via any suitable technique (i.e., not only via distillation). Moreover, the purification technique may be the same as or different from the technique utilized to prepare the crude reaction product from the reaction product. In certain embodiments, purifying the crude reaction product to give the purified reaction product comprises distilling the crude reaction product. Likewise, in specific embodiments, purifying the crude reaction product comprises fractionally distilling the crude reaction product. Distilling the crude reaction product may comprise any distillation conditions, including those described above with regard to distilling the reaction product.

In particular embodiments, isolating the 1,1,1-tris(organoamino)disilane compound from the reaction product comprises filtering the reaction product to give the crude reaction product, and then distilling the crude reaction product to give the 1,1,1-tris(organoamino)disilane compound (e.g. in the purified reaction product). In these embodiments, distilling the crude reaction product comprises distilling volatile contents away from the crude reaction product to give (i.e., provide or leave) the 1,1,1-tris(organoamino)disilane compound. In such embodiments, distilling the volatile contents away from the crude reaction product may be performed on a rotary evaporator or the like.

In some embodiments, the preparation method includes aminating the 1,1,1-trihalodisilane to prepare the reaction product comprising the 1,1,1-tris(organoamino)disilane compound in multiple batches, such as 2, 3, 4, 5, 6, 7, 8, 9, or 10 batches. However, as understood by those of skill in the art, the number of particular batches is not limited and may be, for example from 2 to 50, alternatively from 3 to 40, alternatively from 4 to 30, alternatively from 5 to 20, batches. Alternatively, the preparation method may include greater than 5, alternatively greater than 15, alternatively greater than 25, alternatively greater than 35, alternatively greater than 45, alternatively greater than 55, batches.

In some such embodiments, the reaction products prepared in each batch, alternatively in any number of the batches, are combined (i.e., pooled) to give a batched reaction product comprising the 1,1,1-tris(organoamino) disilane compound, from which the 1,1,1-tris(organoamino) disilane compound may be isolated as described above. For example, the batched reaction product comprising the 1,1,1-tris(organoamino)disilane compound may be filtered to give a batch-formed crude reaction product, which may then be distilled to isolate the 1,1,1-tris(organoamino)disilane compound therefrom. In certain embodiments, each batch may be individually filtered after aminating the 1,1,1-trihalodisilane to give individual batches of the crude reaction product comprising the 1,1,1-tris(organoamino)disilane compound. In these embodiments, the individual batches of the crude reaction product may then be combined to give a batched crude reaction product comprising the 1,1,1-tris (organoamino)disilane compound, which may then be distilled to isolate the 1,1,1-tris(organoamino)disilane compound therefrom.

As will be readily understood by those of skill in the art in view of the description herein, the batch methods described above may be used individually, sequentially, or in combination, such that any reaction product comprising the 1,1,1-tris(organoamino)disilane compound may be treated as a batch and combined with any other reaction product or crude reaction product comprising the 1,1,1-tris(organoamino)disilane compound. Likewise, any crude reaction product comprising the 1,1,1-tris(organoamino)disilane compound may be treated as a batch and combined with any other crude reaction product or reaction product comprising the 1,1,1-tris(organoamino)disilane compound. The same equally applies to any purified reaction product, which may be combined with any reaction product, crude reaction product, and/or other purified reaction product, e.g. prior to a separate purification process.

The particular techniques used in isolating the 1,1,1-tris (organoamino)disilane compound from any batched reaction product, batched crude reaction product, or batched purified reaction product are typically independently selected, e.g. based on the particular nature of the batched product (i.e., whether crude, purified, or directly from the amination), the number of batches being utilized, the volume of the batched product, the desired purity of the 1,1,1-tris(organoamino) disilane compound being isolated, etc. For sake of reference, a crude reaction product or purified reaction product formed from a batched product (i.e., no matter whether containing reaction product, the crude reaction product, and/or purified reaction product) may be referred to in the same manner as a crude reaction product or purified reaction product formed from a non-batched method (i.e., simply as a/the crude reaction product or a/the purified reaction product, respectively). Likewise, the description herein relating to products containing the 1,1,1-tris(organoamino)disilane compound applies equally to those formed from a single batch and those formed from a batched-method.

In certain embodiments, the reaction product, crude reaction product, and/or purified reaction product comprises halogen and/or halide in an amount of less than 100, alternatively less than 90, alternatively less than 80, alternatively less than 70, alternatively less than 60, alternatively less than 50, alternatively less than 40, alternatively less than 30, alternatively less than 20, alternatively less than 10, alternatively less than 5, ppm. The halogen and/or halide is typically chlorine and/or chloride.

The 1,1,1-tris(organoamino)disilane compound, as described above, may be utilized in or as a composition for forming a film, e.g. a silicon film. As such, the present disclosure provides a film-forming composition comprising the 1,1,1-tris(organoamino)disilane compound.

The particular 1,1,1-tris(organoamino)disilane compound utilized in the film-forming composition may be any of the 1,1,1-tris(organoamino)disilane compounds described herein, such any of the 1,1,1-tris(organoamino)disilane compounds prepared by the preparation method described above. In certain embodiments, the 1,1,1-tris(organoamino) disilane compound utilized in the film-forming composition is a 1,1,1-tris(dialkylamino)disilane compound, such as 1,1,1-tris(dimethylamino)disilane. In some embodiments, the 1,1,1-tris(organoamino)disilane compound utilized in the film-forming composition is a 1,1,1-tris(alkylamino)disilane compound, such as 1,1,1-tris(ethylamino)disilane. In particular embodiments, the film-forming composition comprises more than one of the 1,1,1-tris(organoamino)disilane compounds described above, such as 2, 3, 4, or more individual 1,1,1-tris(organoamino)disilane compounds.

The 1,1,1-tris(organoamino)disilane compound may be utilized in combination with any other precursor compounds understood in the art or may be utilized in the preparation method free from any other precursor compounds. In some embodiments, the film-forming composition comprises an inert gas, molecular hydrogen, a silicon precursor, a carbon precursor, a nitrogen precursor, and/or an oxygen precursor, as described in further detail below. In some embodiments, the film-forming composition comprises at least one of the inert gas, silicon precursor, nitrogen precursor, and oxygen precursor.

In some embodiments, the film-forming composition comprises molecular hydrogen. The molecular hydrogen may be synthesized, prepared, or otherwise obtained.

In some embodiments, the film-forming composition comprises the silicon precursor. The silicon precursor may be any silicon precursor suitable for forming a film. Typically, the silicon precursor is substantially free from, alternatively is free from, 1,1,1-tris(organoamino)disilane compounds. Suitable silicon precursors include silanes (including alkyl-, alkoxy, amino-, hydrido-, thio-, and halosilanes), silylamines, siloxanes, silylazides, silylhydrazine, disilanes, disilazanes, disiloxanes, and the like, derivatives thereof, and combinations thereof. The silicon precursor may be provided in any manner. For example, the silicon precursor may by synthesized, prepared, or otherwise obtained. Silicon precursors are commercially available from various suppliers.

In some embodiments, the film-forming composition comprises the carbon precursor. The carbon precursor may be any carbon precursor suitable for use in forming a film. Typically, the carbon precursor is substantially free from, alternatively is free from, 1,1,1-tris(organoamino)disilane compounds. Furthermore, the carbon precursor may be provided in any manner. For example, the carbon precursor may by synthesized, prepared, or otherwise obtained. The carbon precursor typically comprises, alternatively consists essentially of, alternatively consists of C and H atoms, and optionally N, O, and Si atoms. For example, the carbon precursor may comprise C, H, and N atoms, e.g. when the carbon precursor is used in the method for forming a silicon carbonitride film. Likewise, the carbon precursor may comprise C, H, and O atoms, e.g. when the carbon precursor is used in the method for forming a silicon oxycarbide film. Similarly, the carbon precursor may comprise N and O atoms, e.g. when the carbon precursor is used in the method for forming a silicon oxycarbonitride film. In some embodiments the carbon precursor consists essentially of C, H, and optionally Si atoms, and lacks N and O atoms. In these or other embodiments, the carbon precursor may comprise one or more halogen atoms (e.g., Cl). Examples of the carbon precursor consisting of C and H atoms include hydrocarbons, such as alkanes. Examples of the carbon precursor consisting of C, H and Si atoms include hydrocarbylsilanes, such as butyldisilane and tetramethylsilane.

In some embodiments, the film-forming composition comprises the nitrogen precursor. The nitrogen precursor may be any nitrogen precursor suitable for use in forming a film. Typically, the nitrogen precursor is substantially free from, alternatively is free from, 1,1,1-tris(organoamino) disilane compounds. Furthermore, the nitrogen precursor may be provided in any manner. For example, the nitrogen precursor may by synthesized, prepared, or otherwise obtained. The nitrogen precursor typically comprises, alternatively consists essentially of, alternatively consists of N atoms, and optionally H, C, and/or O atoms. Typically, the nitrogen precursor comprises N and H atoms. In some embodiments, the nitrogen precursor may further comprise C atoms, e.g. when the nitrogen precursor is used in the method for forming a silicon carbonitride film. In these or other embodiments, the nitrogen precursor may further comprise O atoms, e.g. when the nitrogen precursor is used in the method for forming a silicon oxynitride film. Likewise, the nitrogen precursor may further comprise C and O atoms, e.g. when the nitrogen precursor is used in the method for forming a silicon oxycarbonitride film. In certain embodiments, the nitrogen precursor consists essentially of N atoms and optionally H atoms, and lacks C and O atoms. In these or other embodiments, the nitrogen precursor may comprise one or more halogen atoms (e.g., Cl). A particular example of the nitrogen precursor consisting of N atoms is molecular nitrogen. Examples of the nitrogen precursor consisting of N and H atoms include ammonia and hydrazine. Examples of the nitrogen precursor consisting of O and N atoms include nitric oxide ($N_2O$) and nitrogen dioxide ($NO_2$).

In some embodiments, the film-forming composition comprises the oxygen precursor. The oxygen precursor may be any oxygen precursor suitable for use in forming a film. Typically, the oxygen precursor is substantially free from, alternatively is free from, 1,1,1-tris(organoamino)disilane compounds. Furthermore, the oxygen precursor may be provided in any manner. For example, the oxygen precursor may by synthesized, prepared, or otherwise obtained. The oxygen precursor typically comprises, alternatively consists essentially of, alternatively consists of O atoms, and optionally H, C, and/or N atoms. In some embodiments, the oxygen precursor comprises O and C atoms, and optionally H atoms, e.g. when the oxygen precursor is used in the method for forming a silicon oxycarbide film. In these or other embodiments, the oxygen precursor may further comprise N atoms, e.g. when the oxygen precursor is used in the method for forming a silicon oxynitride film. In particular embodiments, the oxygen precursor comprises O, C, and N atoms, e.g. when the oxygen precursor is used in the method for forming a silicon oxycarbonitride film. Examples of the oxygen precursor consisting of O atoms include molecular oxygen and ozone, such as ozone delivered at up to 5% v/v in air, and ozone delivered at up to 14% v/v in molecular oxygen. Examples of the oxygen precursor consisting of O and H atoms include water and hydrogen peroxide. Examples of the oxygen precursor consisting of O and N atoms include nitric oxide and nitrogen dioxide.

It is to be appreciated that a single precursor may be used as any one or more of the silicon, carbon, nitrogen, and oxygen precursors, depending on the chemical composition and structure of the particular precursor chosen. For example, a particular precursor comprising N, C, and O atoms may be described as a carbon, a nitrogen, and/or an oxygen precursor, based on the ability of the particular compound to incorporate N, C, and/or O atoms into the film being formed.

In some embodiments, the film-forming composition comprises the inert gas. Examples of the inert gas include helium, argon, and mixtures thereof. In some embodiments, the inert gas comprises helium. In these embodiments, the helium may be used in combination with the 1,1,1-tris(organoamino)disilane compound(s) and molecular hydrogen, e.g. for use in the method for forming an elemental film. Similarly, the helium may be used in combination with the 1,1,1-tris(organoamino)disilane compound(s) and any one of the carbon precursor, nitrogen precursor and oxygen precursor, e.g. for use in the method for forming a silicon carbon film, a silicon nitrogen film, or a silicon oxygen film, respectively.

With regard to forming the film, as described below, the film-forming composition may comprise the molecular hydrogen, silicon precursor, carbon precursor, nitrogen precursor, and/or the oxygen precursor in a vaporous or gaseous state. In such instances, and as understood in the art, the vaporous or gaseous state of the molecular hydrogen, silicon precursor, carbon precursor, nitrogen precursor, and/or the oxygen precursor may generally be referred to as a reactant gas.

As introduced above, the present disclosure provides a method of forming a film with the silicon-film forming composition comprising the 1,1,1-tris(organoamino)disilane compound, or a combination of two or more of the 1,1,1-tris(organoamino)disilane compounds (the "formation method"). The formation method comprises subjecting the film-forming composition comprising the 1,1,1-tris(organoamino)disilane compound(s) to a deposition condition in the presence of a substrate, thereby forming the film on the substrate.

Typically, the formation method utilizes a deposition apparatus. In particular, the deposition apparatus is typically utilized to subject the film-forming composition to deposition conditions, which are described below. In some embodiments, the film-forming composition is prepared in the deposition apparatus.

The deposition apparatus utilized in the formation method is generally selected based upon the desired method of forming the film, and may be any deposition apparatus understood by those of skill in the art. Generally, the deposition apparatus is selected by balancing a number of factors, such as the particular components utilized in the film-forming composition, a desired purity of the film, a geometric configuration of the substrate, and particular economic considerations. Typically, the deposition apparatus comprises a physical or chemical deposition apparatus. As such, in particular embodiments, the formation method may be further defined as a chemical or physical deposition method.

In certain embodiments, the deposition apparatus comprises a physical vapor deposition apparatus. In these embodiments, the deposition apparatus is typically a sputtering apparatus, for example a direct current (DC) magnetron sputtering apparatus. The optimum operating parameters of each of these physical deposition vapor apparatuses may vary, and are typically selected based upon, e.g. the particular components utilized in the film-forming composition utilized in the formation method and the desired application in which the film formed via the deposition apparatus is utilized.

In some embodiments, the deposition apparatus comprises a sputtering apparatus. The sputtering apparatus may be, for example, an ion-beam sputtering apparatus, a reactive sputtering apparatus, or an ion-assisted sputtering apparatus.

In particular embodiments, the deposition apparatus comprises an atomic layer deposition apparatus. In such embodiments, the formation method may be further defined as an atomic layer deposition method, and may include plasma enhanced atomic layer deposition (PEALD), spatial atomic layer deposition (SALD), and/or thermal atomic layer deposition (TALD).

In certain embodiments, the deposition apparatus comprises a chemical vapor deposition apparatus. In these embodiments, the deposition apparatus is typically a flowable chemical vapor apparatus, a thermal chemical vapor deposition apparatus, a plasma enhanced chemical vapor deposition apparatus, a photochemical vapor deposition apparatus, an electron cyclotron resonance apparatus, an inductively coupled plasma apparatus, a magnetically confined plasma apparatus, a low pressure chemical vapor deposition apparatus, or a jet vapor deposition apparatus. The optimum operating parameters of each of these chemical deposition vapor apparatuses may vary, and are typically selected based upon, e.g. the particular components utilized in the film-forming composition utilized in the formation method and the desired application in which the film formed via the deposition apparatus is utilized. In certain embodiments, the deposition apparatus comprises a plasma enhanced chemical vapor deposition apparatus. In other embodiments, the deposition apparatus comprises a low pressure chemical vapor deposition apparatus.

As understood in the art, chemical vapor deposition typically comprises mixing and reacting components (e.g. gases) of a film-forming composition in a deposition chamber. Mixing and reacting the gases is utilized to form precursors and/or film elements in a vapor state. The precursors and/or film elements are then deposited on a substrate (e.g. a wafer) to form the film. As such, chemical vapor deposition generally requires an addition of energy, e.g. via heating of the deposition chamber and/or substrate. Accordingly, in some embodiments, the formation method comprises forming a vapor from the silicon-film forming composition comprising the 1,1,1-tris(organoamino)disilane compound(s). In such embodiments, the formation method further comprises subjecting the vapor to deposition conditions in the presence of a substrate to form the film on the substrate.

Reaction of gaseous species is generally understood in the art and any conventional chemical vapor deposition (CVD) technique can be utilized in the formation method. For example, techniques such as simple thermal vapor deposition, plasma enhanced chemical vapor deposition (PECVD), electron cyclotron resonance (ECRCVD), atmospheric pressure chemical vapor deposition (APCVD), low pressure chemical vapor deposition (LPCVD), ultrahigh vacuum chemical vapor deposition (UHVCVD), aerosol-assisted chemical vapor deposition (AACVD), direct liquid injection chemical vapor deposition (DLICVD), microwave plasma-assisted chemical vapor deposition (MPCVD), remote plasma-enhanced chemical vapor deposition (RPECVD), atomic layer chemical vapor deposition (ALCVD), hot wire chemical vapor deposition (HWCVD), hybrid physical-chemical vapor deposition (HPCVD), rapid thermal chemical vapor deposition (RTCVD), and vapor-phase epitaxy chemical vapor deposition (VPECVD), photo-assisted chemical vapor disposition (PACVD), flame assisted chemical vapor deposition (FACVD), or any similar technique, may all be used.

Typically, the main operating variables manipulated in the formation method include reactor (i.e., deposition apparatus) temperatures, substrate temperatures, pressures, concentrations in the gas phase of the 1,1,1-tris(organoamino)disilane compound(s), gas concentrations of other components in the film-forming composition (e.g., concentration in the gas phase of any silicon precursor, carbon precursor, nitrogen precursor, and/or oxygen precursor), total gas flow, and the particular substrates utilized. As understood in the art, typical deposition methods utilize chemical reactions such as pyrolysis, oxidation, reduction, hydrolysis, condensation, coupling and combinations thereof. For example, in particular embodiments, the deposition conditions of the formation method comprise hydrolyzing and/or oxidizing the 1,1,1-tris(organoamino)disilane compound(s), such that the film formed by the formation method is a silicon dioxide film. As such, it is to be appreciated that the main operating variables may be varied, and are typically selected based on the kinetics and thermodynamics of the components of the film-forming composition (e.g. the 1,1,1-tris(organoamino) disilane compound(s)), and any chemical reaction(s) utilized. As such, the particular deposition conditions described below are illustrative and not limiting, and thus may be deviated from to perform the formation method.

The formation method may be carried out at any reactor temperature. For example, the formation method may be carried out at a reactor temperature of from 100 to 1000, alternatively from 200 to 800, alternatively from 200 to 700, alternatively from 300 to 700, alternatively from 300 to 600, ° C. Furthermore, the formation method may utilize multiple reactor temperatures, including temperature ramps (increasing and/or decreasing). As such, the reactor temperature at which the formation method is carried out may be isothermal or dynamic. Likewise, the formation method may be carried out at any pressure, such as from 0.01 to 100, alternatively from 0.1 to 100, alternatively from 0.1 to 50, alternatively from 1 to 10, Torr.

The formation method may be utilized to form films having a wide variety of thicknesses. For instance, the film may have a thickness of a few nanometers or a thickness of a few microns, or a greater or lesser thickness (or a thickness falling between these values). Typically, the thickness of the film is selected based on various parameters, e.g. a desired end use of the film. Accordingly, the formation method may comprise forming the film to any thickness on the substrate. For example, in certain embodiments, the film is formed on the substrate to a thickness of from 0.01 nanometers (nm) to 1 micrometer (μm). In particular embodiments, the film formed on the substrate has an average thickness of from 0.1 to 100, alternatively from 1 to 100, alternatively from 10 to 100, nm. The film thickness may be uniform or may vary.

It is to be appreciated that the particular components of the film-forming composition and the main operating variables may influence the structure and properties of the film. As such, the formation method may include controlling an orientation of film structure, a manner in which the film coalesces, a uniformity of the film, a crystalline/non-crystalline structure of the film, and combinations thereof.

Furthermore, environments which facilitate a desired deposition property can also be used in the deposition apparatus (e.g. in the deposition chamber). For instance, reactive environments such as air, oxygen, oxygen plasma, ammonia, amines, hydrazine, nitrous oxide, etc. may all be used herein. Accordingly, in certain embodiments, the formation method may include using a reactive environment in the deposition apparatus. In other embodiments, or inert environment is utilized in the deposition apparatus.

The substrate utilized in the formation method is not limited, and may be any substrate suitable for use in one or more of the deposition techniques described herein. Typically, the substrate is selected at least in part based on a need for thermal and/or chemical stability, e.g. at a temperature and/or in an environment of the deposition chamber utilized. Thus, the substrate may comprise any material. Examples of suitable substrates include glasses, metals, plastics, ceramics, and combinations thereof. Particular examples of suitable substrates include semiconductors, such as silicon (e.g. monocrystalline silicon, polycrystalline silicon, amorphous silicon, etc.). Additionally, the substrate can have a flat or patterned surface. Typically, a patterned surface has features with an aspect ratio ranging from 1 to 500, alternatively from 1 to 50, alternatively from 10 to 50. As such, it is to be appreciated that the films formed by the formation method may be conformal on flat and/or patterned substrate surfaces.

As introduced above, the present disclosure also provides a film formed in accordance with the formation method.

As will be appreciated from description of the formation method above, the composition and structure of the film is a function of the deposition apparatus and the associated parameters, the particular components utilized in the film-forming composition utilized, and the presence or absence of any reactive environment during the formation method. For example, the film may be an amorphous, a polycrystalline, and/or a monocrystalline film.

The film comprises Si atoms. Furthermore, because the 1,1,1-tris(organoamino)disilane compound comprises Si—N bonds, the film typically comprises N atoms. In some embodiments, such as when the film-forming composition comprises the carbon precursor and/or the oxygen precursor, the film may also comprise C and/or O atoms. As such, the film may be a silicon nitrogen film (e.g. a silicon nitride film), a silicon oxygen film, a silicon carbon film (e.g. a silicon carbide film), or a combination thereof. Accordingly, it is to be appreciated that the film may comprise various functional groups, such as silicon, silicon carbides, silicon nitrides, silicon oxides, silicon oxynitrides, silicon oxycarbonitrides, silicon oxycarbides, and the like, and combinations thereof. In particular embodiments, the film is a silicon dioxide film.

In certain embodiments, the film may be covered by a coatings, such as an $SiO_2$ coating, $SiO_2$/modifying ceramic oxide coatings, silicon-containing coatings, silicon carbon-containing coatings, silicon carbide-containing coatings, silicon nitrogen-containing coatings, silicon nitride-containing coatings, silicon nitrogen carbon-containing coatings, silicon oxygen nitrogen containing coatings, and/or diamond like carbon coatings. Such coatings and their methods of deposition are generally understood in the art.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, different, special, and/or unexpected results may be obtained from each member of the respective Markush group independent from all other Markush members. Each member of a Markush group may be relied upon individually and or in combination and provides adequate support for specific embodiments within the scope of the appended claims.

Further, any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The following examples are intended to illustrate the invention and are not to be viewed in any way as limiting to the scope of the invention.

EXAMPLES

GC Conditions: A gas chromatograph (GC) (Agilent model 7890A) is equipped with a capillary column (30 m length; 0.32 mm inner diameter) containing a stationary phase (phenyl methyl siloxane; 0.25 µm thick), and set to an inlet temperature (200° C.). A carrier gas (helium) is fed through the capillary column at a flow rate (105 mm/min per minute), and samples are analyzed using a temperature profile including a soaking (holding) at 50° C. (2 min), a ramping to 250° C. (at a rate of 15° C./minute), and a soaking (holding) at 250° C. (10 min).

Example 1

Synthesis of 1,1,1-Tris(dimethylamino)disilane: Liquid dimethylamine (3.23 g; 71.8 mmol; 6.6 eq.) is prepared by condensing gaseous dimethylamine in a Schlenk tube. The liquid dimethylamine is transferred into anhydrous hexane (100 ml) in a 250 ml round bottom flask at −20° C. to give an aminating agent comprising dimethylamine (dimethylamine-hexane sol.). The aminating agent is then cooled to −5° C. A solution of 1,1,1-trihalodisilane (1,1,1-trichlorodisilane; 1.80 g; 10.9 mmol; 1 eq.) in hexane (10 ml) is added to the aminating agent over 15 minutes at −5° C. to give a slurry. The slurry is agitated for 3 hours at room temperature to give a reaction product comprising 1,1,1-tris(dimethylamino)disilane. The reaction product is then filtered, and the filtrate concentrated in vacuo (1 Torr) to isolate the reaction product comprising 1,1,1-tris(dimethylamino)disilane as a clear liquid (1.04 g; ~74 wt. % 1,1,1-tris(dimethylamino)disilane via GC-FID).

Example 2

Synthesis of 1,1,1-Tris(ethylamino)disilane: Ethylamine (3.95 g; 87.7 mmol; 6.6 eq.) is condensed transferred into anhydrous hexane (100 ml) in a 250 ml round bottom flask equipped with a magnetic stir bar to form an aminating agent comprising ethylamine (ethylamine-hexane sol.). The aminating agent is then cooled down to 5° C. A solution of 1,1,1-trihalodisilane (1,1,1-trichlorodisilane; 2.20 g; 13.3 mmol; 1 eq.) in hexane (20 ml) is added to the aminating agent over 40 minutes at 5-8° C. under magnetic stirring to give a slurry. The slurry is stirred for 1 hour at room temperature to give a reaction product comprising 1,1,1-tris(ethylamino)disilane. The reaction product is then filtered, and the filtrate is concentrated in vacuo (1 Torr) to isolate the reaction product comprising 1,1,1-tris(ethlamino)disilane as a clear colorless liquid (1.93 g; ~83 wt. % 1,1,1-tris(ethylamino)disilane via GC-TCD).

Example 3

Batched-Synthesis of 1,1,1-Tris(dimethylamino)disilane: Dimethylamine (43.0 g; 0.954 mol; 6.6 eq.) is condensed and dissolved in anhydrous hexane (700 ml) in a 1 L round bottom flask to give an aminating agent comprising dimethylamine (dimethylamine-hexane sol.). The aminating agent is then cooled to 1° C. A solution of 1,1,1-trihalodisilane (1,1,1-trichlorodisilane; 23.9 g; 0.144 mol; 1 eq.) in anhydrous hexane (150 ml) is added to the aminating agent over 95 minutes at 1-6° C. under 300 rpm agitation (mechanical agitator) to give a slurry. The slurry is then agitated for 12 hours at room temperature to form a reaction product comprising 1,1,1-tris(dimethylamino)disilane. The reaction product is then filtered to give a crude reaction product comprising 1,1,1-tris(dimethylamino)disilane as clear yellow filtrate. The previous steps are then repeated eight additional times to give nine individual filtrates (i.e., batches), which are combined (i.e., batched) and concentrated in vacuo (1 Torr) to isolate the reaction product comprising 1,1,1-tris(dimethylamino)disilane as a clear yellow liquid (173 g). The reaction product comprising 1,1,1-tris(dimethylamino)disilane is then fractionally distilled (10" Vigreux column) a under vacuum to isolate from the reaction product the 1,1,1-tris(dimethylamino)disilane (46.2 g; 98.5% GC-TCD purity).

Comparative Example 1

A solution of 1,1,1-trihalodisilane (1,1,1-trichlorodisilane; 1.50 g; 9.08 mmol; 1 eq.) in hexane (5 mL) is added to a stirring solution of an aminating agent (lithium dimethylamide; 1.53 g; 30.0 mmol; 3.3 eq.) in hexane (45 mL) at room temperature to give a first reaction mixture. The first reaction mixture is held at room temperature (20° C.) for 12 hours, filtered, and concentrated in vacuo to give tris(dimethylamino)silane.

Comparative Example 2

A solution of 1,1,1-trihalodisilane (1,1,1-trichlorodisilane; 1.53 g; 9.24 mmol; 1 eq.) in hexane (5 mL) is added to a stirring solution of an aminating agent (lithium diethylamide; 2.41 g; 30.5 mmol; 3.3 eq.) in hexane (53 mL) at room temperature to give a second reaction mixture. The second reaction mixture is held at room temperature (20° C.) for 12 hours, filtered, and concentrated in vacuo to give tris(diethylamino)silane.

Comparative Example 3

A solution of 1-halo-1,1-bis(diethylamino)disilane (1-chloro-1,1-bis(diethylamino)disilane; 0.71 g; 2.96 mmol; 1 eq.) in hexane (5 mL) is added to a stirring solution of an aminating agent (lithium diethylamide; 0.23 g; 2.96 mmol; 1 eq.) in hexane (10 mL) at room temperature to give a third reaction mixture. The third reaction mixture is held at room temperature (20° C.) for 1 hour, filtered, and concentrated in vacuo to give tris(diethylamino)silane.

Comparative Example 4

A solution of 1,1,1-trihalodisilane (1,1,1-trichlorodisilane; 1.80 g; 10.9 mmol; 1 eq.) in hexane (5 mL) is added to a stirring solution of an aminating agent (ethylmethylamine; 2.12 g; 35.9 mmol; 3.3 eq.) and a halogen scavenging agent (trimethylamine; 3.63 g; 35.9 mmol; 3.3 eq.) in hexane (90 mL) at −5° C. to give a fourth reaction mixture. The fourth reaction mixture is warmed to room temperature (20° C.) with continuous stirring, held at room temperature for 30 minutes, filtered, and concentrated in vacuo to give chlorobisaminodisilane.

Comparative Example 5

A solution of 1,1,1-trihalodisilane (1,1,1-trichlorodisilane; 1.84 g; 11.1 mmol; 1 eq.) in hexane (10 mL) is added to a stirring solution of an aminating agent (diethylamine; 5.35 g; 73.2 mmol; 6.6 eq.) in hexane (100 mL) at −5° C. to give a fifth reaction mixture. The fifth reaction mixture is warmed to room temperature (20° C.) with continuous stirring, held at that temperature for 1.5 hours, filtered, and concentrated in vacuo to give chlorobisaminodisilane.

Comparative Example 6

1,1,1-trihalodisilane (1,1,1-trichlorodisilane; 2.14 g; 12.9 mmol; 1 eq.) is added to a stirring aminating agent (diethylamine; 47.3 g; 646 mmol; 50 eq.) at −5° C. to give a sixth reaction mixture. The sixth reaction mixture is warmed to room temperature (20° C.) with continuous stirring, held at that temperature for 30 minutes, filtered, and concentrated in vacuo to give a mixture of 1-chloro-1,1-bis(diethylamino)disilane and tris(diethylamino)silane.

Prophetic Example 1: ALD

A silicon oxide film is formed using the 1,1,1-tris(dimethylamino)disilane compound with atomic layer deposition (ALD). An ALD reactor containing a substrate (silicon wafer) heated to 200° C. is equipped with a canister containing the 1,1,1-tris(dimethylamino)disilane compound at room temperature (i.e., approximately 23° C.). The ALD reactor is purged with helium, and a vapor of the 1,1,1-tris (dimethylamino)disilane compound is flowed into the ALD reactor for 2 seconds. The ALD reactor is then purged again with helium. An oxygen plasma is then flowed into the ALD reactor for 5 seconds. The foregoing flow sequence (i.e., of 1,1,1-tris(dimethylamino)disilane, purge, oxygen plasma, purge) is repeated until a silicon oxide film with a desired thickness is formed on the substrate.

Prophetic Example 2: CVD (e.g. LPCVD)

A silicon nitride film is formed using the 1,1,1-tris(dimethylamino)disilane compound with chemical vapor deposition (CVD). A CVD reactor containing a substrate (silicon wafer) heated to 500° C. is equipped with a canister containing the 1,1,1-tris(dimethylamino)disilane compound. A nitrogen precursor (ammonia) is added to the CVD reactor as a vapor. A vapor of the 1,1,1-tris(dimethylamino)disilane compound is flowed into the CVD reactor using an inert gas (helium) until a silicon nitride film with a desired thickness is formed on the substrate.

The invention has been described in an illustrative manner, and it is to be understood that the terminology which has been used is intended to be in the nature of words of description rather than of limitation. Obviously, many modifications and variations of the present invention are possible in light of the above teachings. The invention may be practiced otherwise than as specifically described.

The invention claimed is:

1. A 1,1,1-tris(organoamino)disilane compound having the following formula:

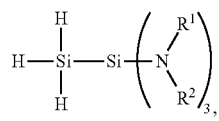

wherein: (i) each $R^1$ and $R^2$ is —$CH_3$, such that the 1,1,1-tris(organoamino)disilane compound is 1,1,1-tris (dimethylamino)disilane; or (ii) each $R^1$ is H and each $R^2$ is —$CH_2CH_3$, such that the 1,1,1-tris(organoamino) disilane compound is 1,1,1-tris(ethylamino)disilane.

2. A method of preparing a 1,1,1-tris(organoamino)disilane compound, said method comprising:
aminating a 1,1,1-trihalodisilane with an aminating agent to give a reaction product comprising the 1,1,1-tris (organoamino)disilane compound, thereby preparing the 1,1,1-tris(organoamino)disilane compound;
wherein the aminating agent comprises an organoamine compound having the formula $HNR^1R^2$, wherein each $R^1$ is an independently selected hydrocarbyl group having from 1 to 10 carbon atoms, and each $R^2$ is an independently selected hydrocarbyl group having from 1 to 10 carbon atoms or H;
wherein the 1,1,1-tris(organoamino)disilane compound having the following formula:

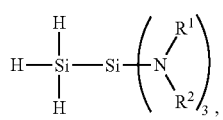

wherein: (i) each $R^1$ and $R^2$ is —$CH_3$, such that the 1,1,1-tris(organoamino)disilane compound is 1,1,1-tris (dimethylamino)disilane, or (ii) each $R^1$ is H and each $R^2$ is —$CH_2CH_3$, such that the 1,1,1-tris(organoamino) disilane compound is 1,1,1-tris(ethylamino)disilane.

3. The method of claim 2, further comprising isolating the 1,1,1-tris(organoamino)disilane compound from the reaction product.

4. The method of claim 3, wherein isolating the 1,1,1-tris (organoamino)disilane compound from the reaction product comprises: (i) filtering the reaction product; (ii) distilling the reaction product; or (iii) both (i) and (ii).

5. The method of any claim 2, wherein the aminating agent further comprises a halogen scavenging agent other than the organoamine compound.

6. The method of claim 5, wherein (i) a molar ratio of the 1,1,1-trihalodisilane to the organoamine compound of the aminating agent is from 1:3 to 1:1000; (ii) a molar ratio of the 1,1,1-trihalodisilane to the halogen scavenging agent of the aminating agent is from 1:3 to 1:1000; or (iii) both (i) and (ii).

7. The method of claim 2, wherein a molar ratio of the 1,1,1-trihalodisilane to the organoamine compound of the aminating agent is from 1:6 to 1:1000.

8. The method of claim 2, wherein: (i) aminating is carried out in a vehicle; (ii) aminating is carried out at a reduced temperature; (iii) the 1,1,1-trihalodisilane is 1,1,1-trichlorodisilane; or (iv) any combination of (i) to (iii).

9. The method of claim 8, wherein aminating is carried out in a vehicle, and wherein the vehicle comprises an organic solvent.

10. The method of claim 8, wherein aminating is carried out at a reduced temperature, and wherein the reduced temperature is less than 0° C.

11. The method of claim 2, wherein aminating comprises combining the 1,1,1-trihalodisilane and the aminating agent to aminate the 1,1,1-trihalodisilane to give the 1,1,1-tris (organoamino)disilane compound.

12. The method of claim 2, wherein: (i) the organoamine compound is dimethylamine, and the 1,1,1-tris(organoamino)disilane compound is 1,1,1-tris(dimethylamino)disilane; or (ii) the organoamine compound is ethylamine, and the 1,1,1-tris(organoamino)disilane compound is 1,1,1-tris (ethylamino)disilane.

13. A reaction product comprising a 1,1,1-tris(organoamino)disilane compound, wherein the reaction product comprising the 1,1,1-tris(organoamino)disilane compound is formed by a method comprising:
aminating a 1,1,1-trihalodisilane with an aminating agent to give a reaction product comprising the 1,1,1-tris (organoamino)disilane compound, thereby preparing the 1,1,1-tris(organoamino)disilane compound,
wherein the 1,1,1-tris(organoamino)disilane compound having the following formula:

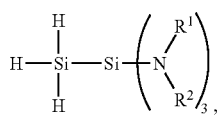

wherein: (i) each $R^1$ and $R^2$ is —$CH_3$, such that the 1,1,1-tris(organoamino)disilane compound is 1,1,1-tris (dimethylamino)disilane; or (ii) each $R^1$ is H and each $R^2$ is —$CH_2CH_3$, such that the 1,1,1-tris(organoamino) disilane compound is 1,1,1-tris(ethylamino)disilane, wherein the aminating agent comprises an organoamine compound having the formula $HNR^3R^4$, wherein each $R^3$ is an independently selected hydrocarbyl group having from 1 to 10 carbon atoms, and each $R^4$ is an independently selected hydrocarbyl group having from 1 to 10 carbon atoms or H.

14. The reaction product of claim 13, wherein the reaction product comprises the 1,1,1-tris(organoamino)disilane compound in an amount of at least 70 wt. % based on the total weight of the reaction product.

15. The reaction product of claim 13, wherein the reaction product has a total content of halogen and/or halide of less than 100 ppm.

16. A film-forming composition, wherein the film-forming composition comprises the 1,1,1-tris(organoamino)disilane compound of claim 1.

17. A method of forming a film, said method comprising:
subjecting a film-forming composition to a deposition condition in the presence of a substrate, thereby forming the film on the substrate;
wherein the film-forming composition is the film-forming composition of claim 16.

18. A film formed by a method comprising:
subjecting a film-forming composition to a deposition condition in the presence of a substrate, thereby forming the film on the substrate,
wherein the film-forming composition is the film-forming composition of claim 16.

\* \* \* \* \*